United States Patent
Huang

(10) Patent No.: US 7,718,345 B2
(45) Date of Patent: May 18, 2010

(54) COMPOSITE PHOTORESIST STRUCTURE

(75) Inventor: Jui-Tsen Huang, Taipei (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 12/102,029

(22) Filed: Apr. 14, 2008

(65) Prior Publication Data

US 2008/0193875 A1 Aug. 14, 2008

Related U.S. Application Data

(60) Continuation of application No. 11/465,811, filed on Aug. 20, 2006, now Pat. No. 7,384,728, which is a continuation of application No. 10/708,983, filed on Apr. 5, 2004, now Pat. No. 7,157,211, which is a division of application No. 10/063,307, filed on Apr. 10, 2002, now Pat. No. 7,125,645.

(51) Int. Cl.
  G03F 7/00 (2006.01)
  G03F 7/09 (2006.01)
  G03F 7/20 (2006.01)
  G03F 7/36 (2006.01)
  G03F 7/48 (2006.01)

(52) U.S. Cl. .......... 430/271.1; 430/270.1; 430/311; 430/313; 430/316; 430/317; 430/296; 430/942; 430/950

(58) Field of Classification Search ............. 430/271.1, 430/270.1, 311, 313, 316, 317, 296, 942, 430/950
See application file for complete search history.

(56) References Cited

U.S. PATENT DOCUMENTS

| | | | |
|---|---|---|---|
| 4,978,594 A | 12/1990 | Bruce et al. |
| 5,441,849 A | 8/1995 | Shiraishi et al. |
| 5,935,762 A | 8/1999 | Dai et al. |
| 6,153,511 A | 11/2000 | Watatani |
| 6,156,629 A | 12/2000 | Tao et al. |
| 6,284,149 B1 | 9/2001 | Li et al. |
| 6,331,380 B1 | 12/2001 | Ye et al. |
| 6,387,798 B1 | 5/2002 | Loke et al. |
| 6,387,819 B1 | 5/2002 | Yu |
| 6,426,298 B1 | 7/2002 | Chen et al. |
| 6,458,689 B2 | 10/2002 | Yu et al. |
| 6,524,964 B2 | 2/2003 | Yu |
| 6,583,047 B2 | 6/2003 | Daniels et al. |
| 7,157,211 B2 | 1/2007 | Huang |

*Primary Examiner*—Amanda C. Walke
(74) *Attorney, Agent, or Firm*—Winston Hsu

(57) ABSTRACT

A composite photoresist structure includes a first organic layer disposed over a substrate to be etched, a sacrificial layer disposed on the first organic layer, and a second organic layer disposed on the sacrificial layer. The thickness of the first organic layer and the thickness of the second organic layer are both larger than the thickness of the sacrificial layer.

32 Claims, 5 Drawing Sheets

COMPOSITE PHOTORESIST STRUCTURE

CROSS REFERENCE TO RELATED APPLICATIONS

This application is a continuation of U.S. application Ser. No. 11/465,811, filed Aug. 20, 2006, which itself is a continuation of U.S. application Ser. No. 10/708,983, filed Apr. 5, 2004. Additionally, application Ser. No. 10/708,983 is itself a divisional of U.S. application Ser. No. 10/063,307, filed Apr. 10, 2002.

BACKGROUND OF THE INVENTION

1. Field of the Invention

The present invention relates to a photoresist structure, and more particularly, to a photoresist structure suitable for sub-micron pattern transfers in semiconductor processes.

2. Description of the Prior Art

Generally, integrated circuit production relies on the use of photolithographic processes and etching processes to define various electrical elements and interconnecting structures on microelectronic devices. With the coming of a generation of Ultra Large Scale Integrated (ULSI) Circuits, the integration of semiconductor devices has gotten larger and larger. G-line (436 nm) and I-line (365 nm) wavelengths of light have been widely used in photolithography processes. However, in order to achieve smaller dimensions of resolution, wavelengths of light used for photolithography processes have been reduced into deep UV regions of 248 nm and 193 nm. Nevertheless, the shorter the wavelengths of light are, the thinner the photoresist layers are. The thin photoresist layers might not be thick enough for blocking the etching processes in the following fabrication. As a result, for a photolithography process utilizing short wavelengths of light, it is necessary to look for a photoresist structure suitable for lithography processes and etching processes.

Please refer to FIG. 1. FIG. 1 is a schematic diagram of a prior art photoresist structure. As shown in FIG. 1, a semiconductor wafer 10 comprises a substrate 12, an anti-reflection layer 14, and a photoresist layer 16. Because wavelengths of light used for exposure processes are related to the depth of focus (DOF), a required thickness of the photoresist layer 16 depends on the wavelengths of light. Accordingly, the thickness of the photoresist layer 16 has to be thin enough so that the molecules in the surface of the photoresist layer have approximately the same focus as the molecules in the bottom of the photoresist layer. However, the photoresist layer 16 is used to be a hard mask on the substrate 12 in the following etching processes. For this reason, the thin photoresist layers might not be thick enough for blocking the following etching processes.

Please refer to FIG. 2. FIG. 2 is a schematic diagram of another prior art photoresist structure used to overcome the above-mentioned problem. As shown in FIG. 2, a semiconductor wafer 20 comprises a substrate 22, a silicon oxynitride layer 24, an anti-reflection layer 26, and a photoresist layer 28. Therein the silicon oxynitride layer 24 serves as a hard mask so that the photoresist layer 28 together with the silicon oxynitride layer 24 can block the etching processes in the following fabrication. After the predetermined pattern of the mask is transferred onto the substrate 22, the silicon oxynitride layer 24, the anti-reflection layer 26, and the photoresist layer 28 are removed. However, the silicon oxynitride layer 24 is not easy to etch away. Thus, the process of removing the silicon oxynitride layer 24 usually causes damage to the surface of the substrate 22.

In addition, methods used to overcome the above-mentioned problem further include bi-layer photoresist technology (U.S. Pat. No. 6,323,287) and top surface image (TSI) technology (U.S. Pat. No. 6,296,989). However, both of the two methods require new photoresist materials. For example, the photoresist layer used in the TSI technology comprises silicon-containing materials. Providing new photoresist materials will increase production costs and increase complexity and difficulty of processes. As a result, it is necessary to look for a photoresist structure suitable for sub-micron pattern transfers in photolithography processes and etching processes.

SUMMARY OF THE INVENTION

It is therefore a primary objective of the claimed invention to provide a composite photoresist structure so as to solve the above-mentioned problem.

According to the claimed invention, a composite photoresist structure includes a first organic layer disposed over a substrate to be etched, a sacrificial layer disposed on the first organic layer, and a second organic layer disposed on the sacrificial layer. The thickness of the first organic layer and the thickness of the second organic layer are both larger than the thickness of the sacrificial layer.

It is an advantage over the prior art that the claimed invention provides a composite photoresist structure including a first organic layer, an inorganic sacrificial layer, and a second organic layer. The first and second organic layers are both thicker than the sacrificial layer. Furthermore, a thickness of the second organic layer can be adjusted according to wavelengths of light sources used in exposure processes. Simultaneously, by adjusting thicknesses of the sacrificial layer and the first organic layer, the composite photoresist structure is thick enough to block following etching processes. Thus, the claimed photoresist structure is suitable for sub-micron pattern transfers in semiconductor processes. In addition, the first organic layer is regarded as a hard mask and it is easily removed by use of plasma. It is a further advantage that removing the first organic layer will not damage the substrate.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
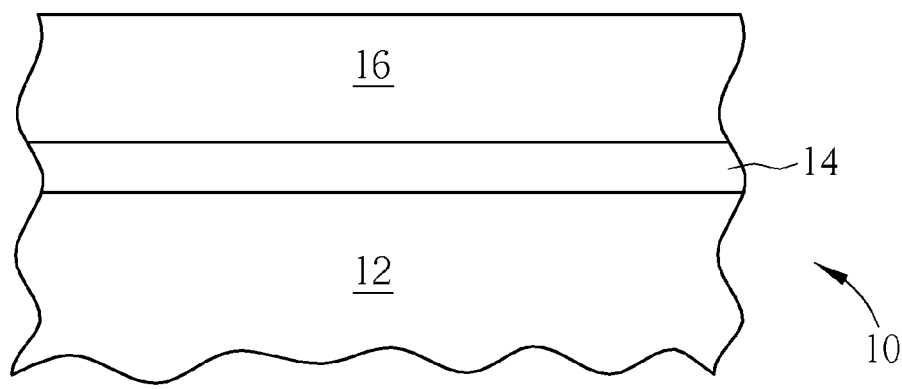
FIG. 1 is a schematic diagram of a prior art photoresist structure.
Figure 2:
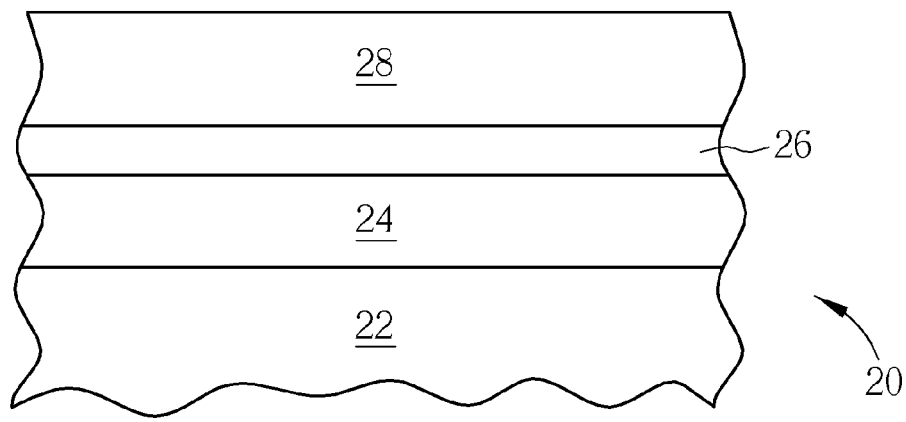
FIG. 2 is a schematic diagram of another prior art photoresist structure.
Figure 3:
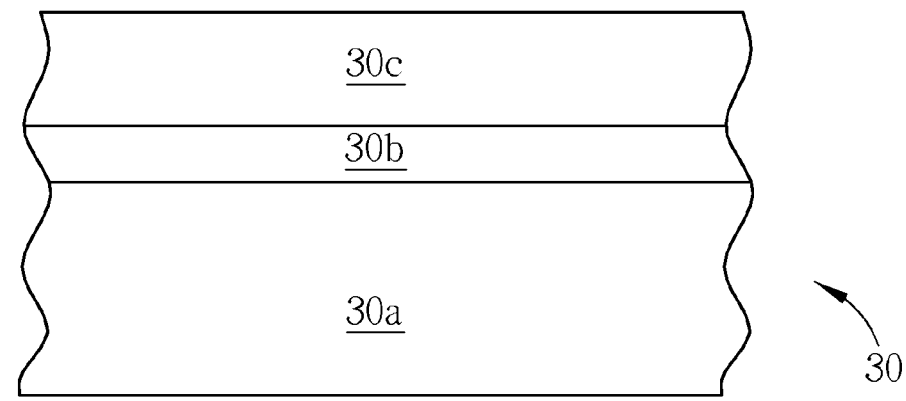
FIG. 3 is a schematic diagram of a composite photoresist structure according to the present invention.

Please refer to FIG. 3. FIG. 3 is a schematic diagram of a composite photoresist structure according to the preferred embodiment of the present invention. As shown in FIG. 3, a composite photoresist structure 30 comprises a first organic layer 30a, a sacrificial layer 30b located on the first organic layer 30a, and a second organic layer 30c located on the sacrificial layer 30b. The first organic layer 30a and the second organic layer 30c both comprise organic materials. The sacrificial layer 30b comprises inorganic materials. In addition, the thickness of the first organic layer 30a and the thickness of the second organic layer 30c are both larger than the thickness of the sacrificial layer 30b. Furthermore, the thickness of the first organic layer 30a is also larger than the thickness of the second organic layer 30c.

In particular, the first organic layer 30a is made of low dielectric organic materials, such as SiLK™. Additionally, the first organic layer 30a is also made of spin-on glass (SOG). Consequently, it is easy to remove the first organic layer 30a by means of plasma, which includes oxygen ($O_2$), nitrogen ($N_2$), hydrogen ($H_2$), argon (Ar), $C_xF_y$, $C_xH_yF_z$, or helium (He) plasma. The sacrificial layer 30b is made of inorganic anti-reflection materials such as silicon oxynitride (SiON) and silicon nitride (SiN). In addition, the sacrificial layer 30b is also made of materials used for conventional hard masks, such as silicon nitride and silicon oxide. Moreover, the second organic layer 30c is made of organic photoresist materials that include positive photoresist materials and negative photoresist materials. Furthermore, the second organic layer 30c is made of organic materials suitable for utilizing in the e-beam lithography process. Noticeably, the composite photoresist structure 30 is suitable for any photolithography processes in the semiconductor fabrication. It should be known by one skilled in the art that a thickness of each of the first organic layer 30a, the sacrificial layer 30b, and the second organic layer 30c could be adjusted according to requirements of processes.

Figure 4A:
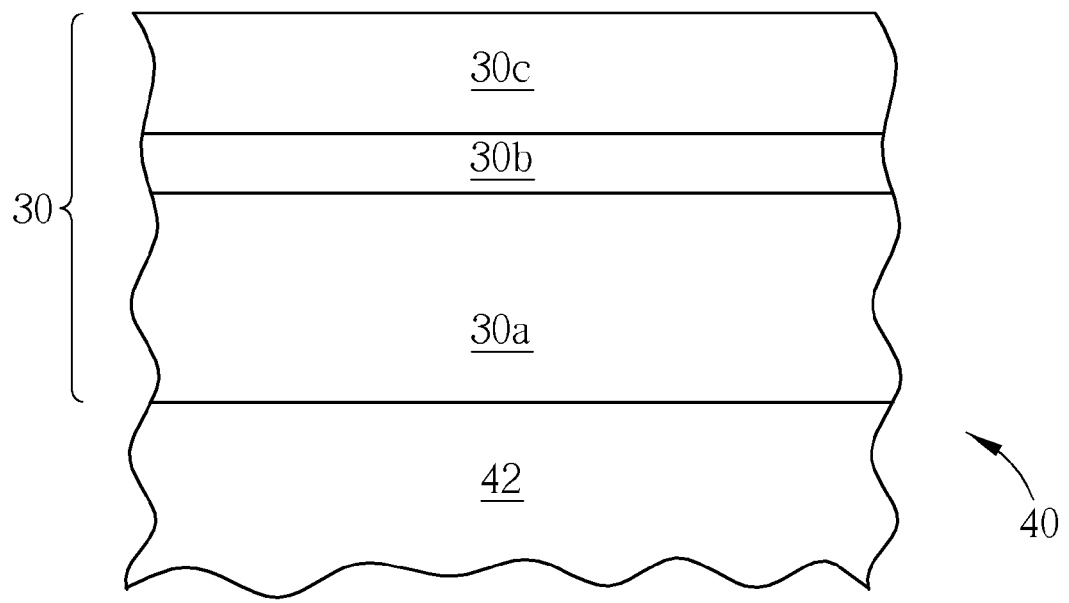
FIG. 4A to FIG. 4F are schematic diagrams illustrating an etching process utilizing the composite photoresist structure.
Figure 4B:
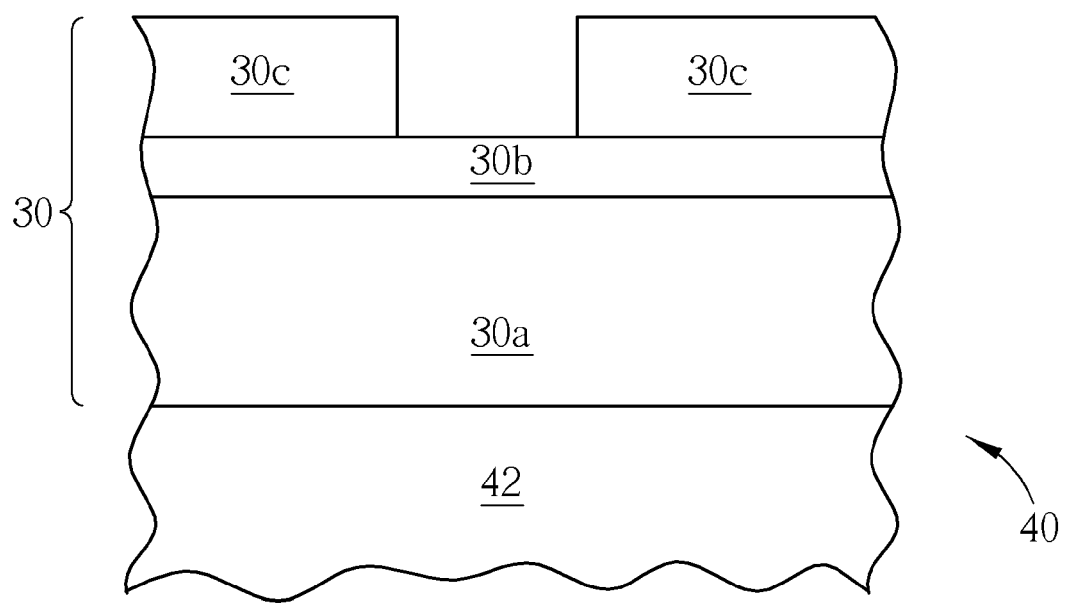
Figure 4C:
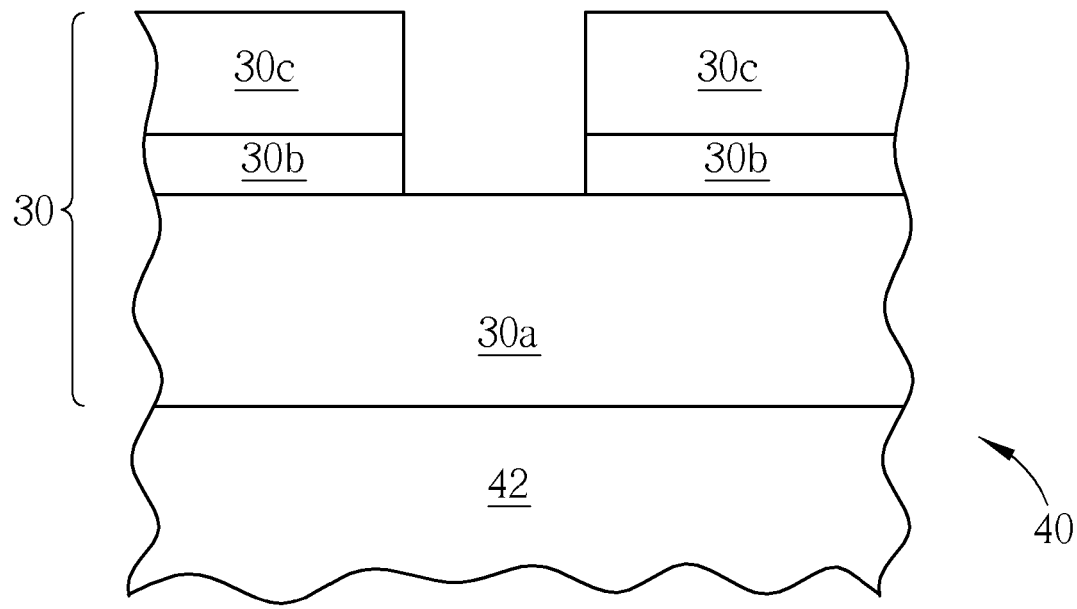

Please refer to FIG. 4A to FIG. 4F. FIG. 4A to FIG. 4F are schematic diagrams illustrating an etching process utilizing the composite photoresist structure 30. As shown in FIG. 4A, a semiconductor wafer 40 comprises a substrate 42 and the composite photoresist structure 30 formed on the substrate 42. The substrate 42 is a silicon substrate, a metal substrate or a dielectric layer, which has a planar and smooth surface. Firstly, as shown in FIG. 4B and FIG. 4C, an exposure process and a development process are performed to transfer a predetermined pattern onto the second organic layer 30c. Then, using the second organic layer 30c as an etching mask, a dry etching process is performed on the sacrificial layer 30b in order to transfer the predetermined pattern in the second organic layer 30c onto the sacrificial layer 30b. Besides, in another embodiment of the present invention, the predetermined pattern can be formed in the second organic layer by utilizing the e-beam lithography process.

Figure 4D:
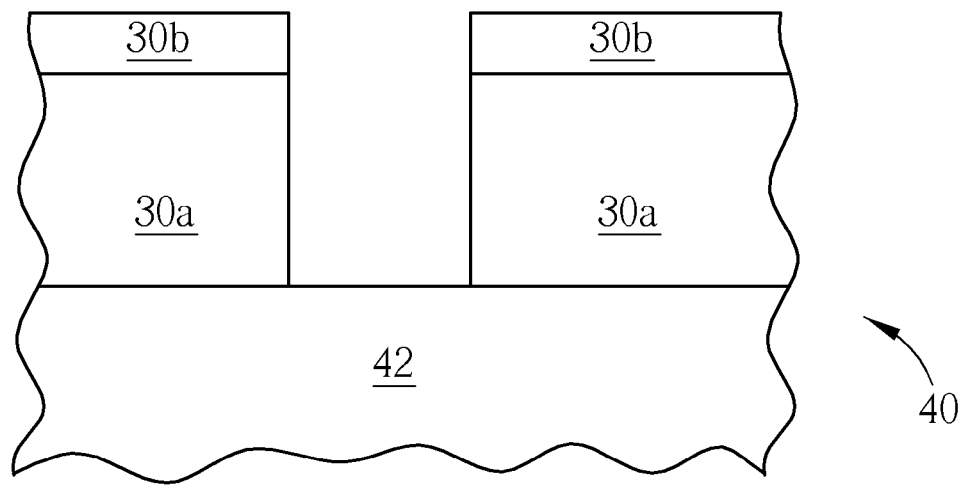
Figure 4E:
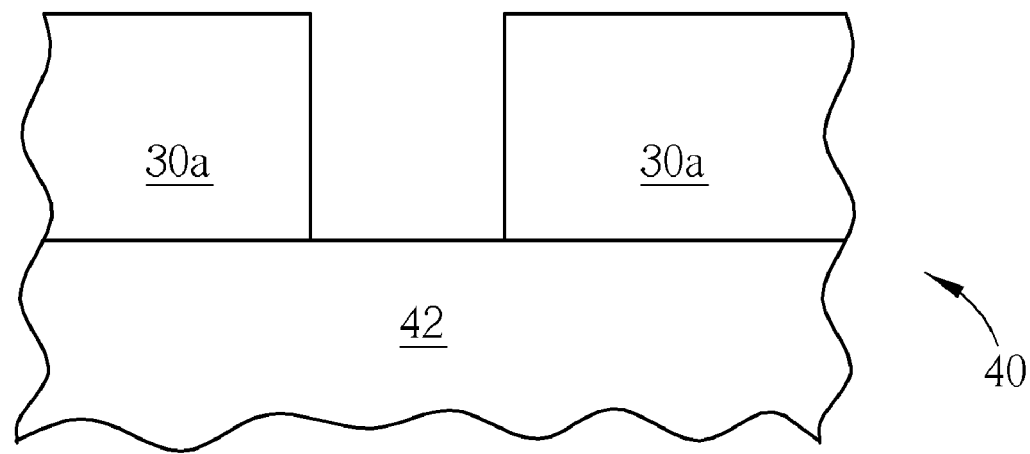
Figure 4F:
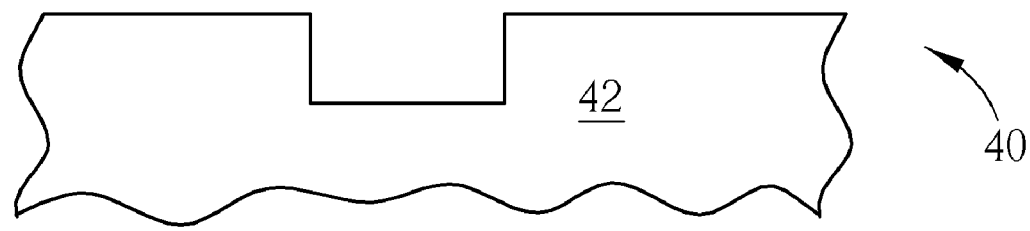

As shown in FIG. 4D to FIG. 4F, utilizing the sacrificial layer 30b to be an etching mask, an anisotropic etching process is performed to transfer the predetermined pattern onto the first organic layer 30a. Then, using the sacrificial layer 30b and the first organic layer 30a as an etching mask, an etching process is performed to transfer the predetermined pattern in the first organic layer 30a onto the substrate 42. While etching the substrate 42, the sacrificial layer 30b is removed concurrently. After transferring the predetermined pattern onto the substrate 42, the first organic layer 30a is subsequently removed. Up to now, the predetermined pattern on the mask is thoroughly transferred onto the substrate 42. The first organic layer 30a is regarded as a hard mask, and its thickness can be adjusted in order to block subsequent etching processes. Thus, the composite photoresist structure 30 can be used in a photolithography process utilizing light sources with wavelengths shorter than 248 nm in deep UV regions. Furthermore, conventional hard masks are generally made out of silicon nitride or silicon oxide, which are not easy to etch away. Hence, an acidic trough is required to remove the conventional hard masks. Conversely, it is easy to remove the first organic layer 30a through use of plasma. Furthermore, removing the first organic layer 30a will not damage the substrate 42.

Figure 5:
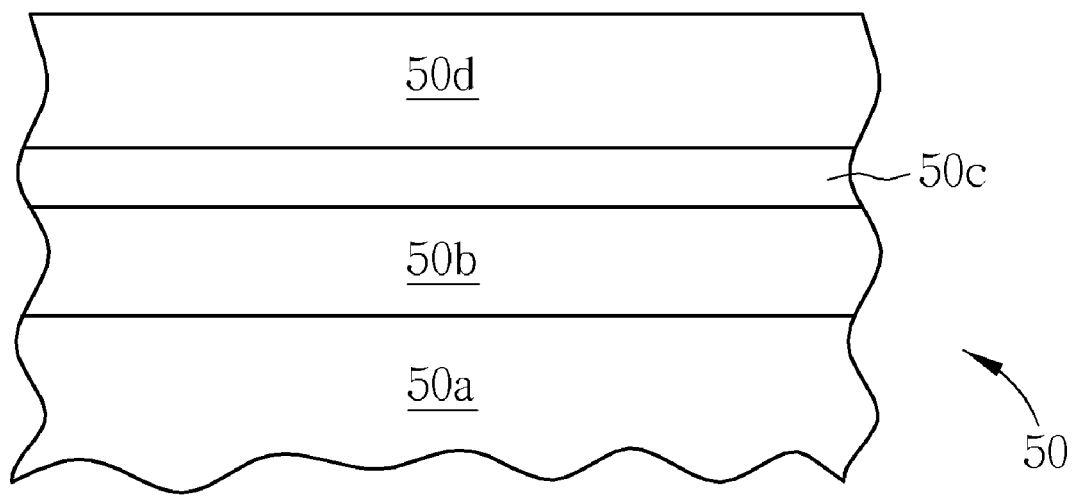
FIG. 5 is a schematic diagram of a composite photoresist structure according to another embodiment of the present invention.

Please refer to FIG. 5. FIG. 5 is a schematic diagram of a composite photoresist structure according to another embodiment of the present invention. As shown in FIG. 5, a composite photoresist structure 50 comprises a first organic layer 50a, a sacrificial layer 50b located on the first organic layer 50a, an anti-reflection layer 50c located on the sacrificial layer 50b, and a second organic layer 50d located on the anti-reflection layer 50c. The first organic layer 50a is made of low dielectric organic materials. In addition, the first organic layer 50a can be made of spin-on glass (SOG). It is easy to remove the first organic layer 50a by use of plasma. The sacrificial layer 50b is made of materials used for hard masks such as silicon nitride and silicon oxide. The anti-reflection layer 50c is made of organic materials used for organic bottom anti-reflection coating such as polyimide and the like. Additionally, the anti-reflection layer 50c can also be made of inorganic materials used for inorganic bottom anti-reflection coating such as silicon oxynitride (SiON). The anti-reflection layer 50c can prevent incident light from reflecting from the substrate to the composite photoresist structure 50. Thus, due to the anti-reflection layer 50c, forming a standing wave in the second organic layer 50d is avoided. The second organic layer 50d is made of organic photoresist materials that comprise positive photoresist materials and negative photoresist materials. As mentioned above, the composite photoresist structure 50 can be utilized in any photolithography processes. It should be known by one skilled in the art that a thickness of each of the first organic layer 50a, the sacrificial layer 50b, the anti-reflection layer 50c, and the second organic layer 50d could be adjusted according to requirements of processes. However, in this embodiment, the first and second organic layers 50a, 50d are both thicker than the sacrificial layer 50b, while the sacrificial layer 50b is thicker than the anti-reflection layer 50c. In addition, the first organic layer 50a is thicker than the second organic layer 50d.

In comparison with the prior art, the present invention provides a composite photoresist structure including a first organic layer, an inorganic sacrificial layer, and a second organic layer. A thickness of the second organic layer could be adjusted according to wavelengths of light sources used in exposure processes. Simultaneously, by adjusting thicknesses of the sacrificial layer and the first organic layer, the composite photoresist structure is thick enough to block ensuing etching processes. Thus, the claimed photoresist structure is suitable for sub-micron pattern transfers in semiconductor processes. As a result, the predetermined pattern of the mask can be accurately transferred onto the semiconductor wafer, and a critical dimension (CD) is therefore controlled well. In addition, the first organic layer is regarded as a hard mask and it is easily removed through use of plasma. It is also an advantage that removing the first organic layer will not damage the substrate.

Those skilled in the art will readily observe that numerous modifications and alterations of the device and method may be made while retaining the teachings of the invention. Accordingly, the above disclosure should be construed as limited only by the metes and bounds of the appended claims.

What is claimed is

1. A composite photoresist structure, comprising:
a first organic layer disposed over a substrate to be etched;

a sacrificial layer disposed directly on the first organic layer; and a second organic layer disposed directly on the sacrificial layer;

wherein a thickness of the first organic layer and a thickness of the second organic layer are both larger than a thickness of the sacrificial layer.

2. The composite photoresist structure of claim 1 wherein the thickness of the first organic layer is larger than the thickness of the second organic layer.

3. The composite photoresist structure of claim 1 wherein the substrate comprises silicon, metal, or dielectric materials.

4. The composite photoresist structure of claim 1 wherein the first organic layer is made of an organic material that is easy to be removed by means of plasma, thereby avoiding damage of the substrate to be etched during a pattern transferring process.

5. The composite photoresist structure of claim 4 wherein the first organic layer is made of low dielectric organic materials.

6. The composite photoresist structure of claim 4 wherein the first organic layer is made of SOG.

7. The composite photoresist structure of claim 4 wherein the plasma is selected from the group consisting of oxygen ($O_2$), nitrogen ($N_2$), hydrogen ($H_2$), argon (Ar), $C_xF_y$, $C_xH_yF_z$, and helium (He) plasma.

8. The composite photoresist structure of claim 1 wherein the sacrificial layer is made of inorganic anti-reflection materials.

9. The composite photoresist structure of claim 1 wherein the sacrificial layer is made of silicon nitride, silicon oxide, or silicon oxynitride.

10. The composite photoresist structure of claim 1 wherein the second organic layer is made of an organic photoresist material capable of absorbing light with a wavelength of 248 nm and the less.

11. The composite photoresist structure of claim 1 wherein the second organic layer is suitable for an e-beam lithography process.

12. The composite photoresist structure of claim 1 wherein the substrate has a planar and smooth surface.

13. The composite photoresist structure of claim 1 wherein the composite photoresist structure is used for transferring a pattern onto the substrate to be etched.

14. The composite photoresist structure of claim 1, wherein the composite photoresist structure will not be left on the substrate to be etched after a pattern transferring process.

15. A composite photoresist structure, comprising:
a first organic layer disposed over a substrate to be etched;
a sacrificial layer disposed directly on the first organic layer;
an anti-reflection layer disposed directly on the sacrificial layer; and
a second organic layer disposed directly on the anti-reflection layer;

wherein a thickness of the first organic layer and a thickness of the second organic layer are both larger than a thickness of the sacrificial layer.

16. The composite photoresist structure of claim 15 wherein the thickness of the first organic layer is larger than the thickness of the second organic layer.

17. The composite photoresist structure of claim 15 wherein the thickness of the sacrificial layer is larger than a thickness of the anti-reflection layer.

18. The photoresist structure of claim 15 wherein the anti-reflection layer is made of organic anti-reflection materials.

19. The photoresist structure of claim 15 wherein the anti-reflection layer is made of inorganic anti-reflection materials.

20. The photoresist structure of claim 19 wherein the anti-reflection layer is made of silicon nitride or silicon oxynitride.

21. The composite photoresist structure of claim 15 wherein the substrate comprises silicon, metal, or dielectric materials.

22. The composite photoresist structure of claim 15 wherein the first organic layer is made of an organic material that is easy to be removed by means of plasma, thereby avoiding damage of the substrate to be etched during a pattern transferring process.

23. The composite photoresist structure of claim 22 wherein the first organic layer is made of low dielectric organic materials.

24. The composite photoresist structure of claim 22 wherein the first organic layer is made of SOG.

25. The composite photoresist structure of claim 22 wherein the plasma is selected from the group consisting of oxygen ($O_2$), nitrogen ($N_2$), hydrogen ($H_2$), argon (Ar), $C_xF_y$, $C_xH_yF_z$, and helium (He) plasma.

26. The composite photoresist structure of claim 15 wherein the sacrificial layer is made of inorganic anti-reflection materials.

27. The composite photoresist structure of claim 15 wherein the sacrificial layer is made of silicon nitride, silicon oxide, or silicon oxynitride.

28. The composite photoresist structure of claim 15 wherein the second organic layer is made of an organic photoresist material capable of absorbing light with a wavelength of 248 nm and the less.

29. The composite photoresist structure of claim 15 wherein the second organic layer is suitable for an e-beam lithography process.

30. The composite photoresist structure of claim 15 wherein the substrate has a planar and smooth surface.

31. The composite photoresist structure of claim 15 wherein the composite photoresist structure is used for transferring a pattern onto the substrate to be etched.

32. The composite photoresist structure of claim 15, wherein the composite photoresist structure will not be left on the substrate to be etched after a pattern transferring process.

* * * * *